United States Patent
Saborido Rodriguez et al.

(10) Patent No.: US 12,157,375 B2
(45) Date of Patent: Dec. 3, 2024

(54) METHOD AND SYSTEM FOR VOLTAGE-BASED DETECTION OF LOSS OF NEUTRAL BETWEEN ON-BOARD CHARGER AND MULTI-PHASE MAINS SUPPLY

(71) Applicant: Lear Corporation, Southfield, MI (US)

(72) Inventors: Victor Saborido Rodriguez, Valls (ES); Sergio Martinez Porras, Valls (ES); Antonio Martinez Perez, Valls (ES); Adria Marcos Pastor, Valls (ES)

(73) Assignee: Lear Corporation, Southfield, MI (US)

( * ) Notice: Subject to any disclaimer, the term of this patent is extended or adjusted under 35 U.S.C. 154(b) by 469 days.

(21) Appl. No.: 17/485,825

(22) Filed: Sep. 27, 2021

(65) Prior Publication Data

US 2022/0242245 A1 Aug. 4, 2022

Related U.S. Application Data

(60) Provisional application No. 63/143,222, filed on Jan. 29, 2021.

(51) Int. Cl.
*B60L 3/00* (2019.01)
*B60L 53/22* (2019.01)
(Continued)

(52) U.S. Cl.
CPC .............. *B60L 3/0046* (2013.01); *B60L 53/22* (2019.02); *G01R 31/3835* (2019.01); *G01R 31/396* (2019.01)

(58) Field of Classification Search
CPC ..... B60L 3/0046; B60L 53/22; G01R 31/396; G01R 31/3835
See application file for complete search history.

(56) References Cited

U.S. PATENT DOCUMENTS

2008/0238655 A1* 10/2008 McShane .................. G06F 1/32
340/538
2014/0176148 A1* 6/2014 Makihara ............. G01R 31/396
324/434
(Continued)

FOREIGN PATENT DOCUMENTS

DE 19858601 A1 6/2000
DE 102013007971 A1 11/2014
(Continued)

OTHER PUBLICATIONS

German Patent and Trademark Office, German Office Action for corresponding German Patent Application No. DE 10 2021 129 579.3 dated Oct. 28, 2022.

*Primary Examiner* — Anshul Sood
*Assistant Examiner* — Oliver Tan
(74) *Attorney, Agent, or Firm* — Brooks Kushman P.C.

(57) ABSTRACT

An on-board battery charger (OBC) includes (i) rail circuits having respective rail controllers and (ii) a main controller. The rail controllers sample voltages supplied to their rail circuits and transmit a fault signal to the main controller upon a comparison between a sampled voltage and a threshold being affirmative of an improper voltage condition (overvoltage or undervoltage) of the sampled voltage. The main controller controls all of the rail controllers to stop operation of all of the rail circuits in response to receiving the fault signal from any of the rail controllers. In a variation, the main controller samples the voltages supplied to the rail circuits and stops operation of all of the rail circuits upon a comparison between a sampled voltage and the threshold being affirmative.

20 Claims, 7 Drawing Sheets

(51) Int. Cl.
*G01R 31/3835* (2019.01)
*G01R 31/396* (2019.01)

(56) References Cited

U.S. PATENT DOCUMENTS

| | | | |
|---|---|---|---|
| 2014/0254050 A1* | 9/2014 | Haines | H02H 3/16 |
| | | | 361/42 |
| 2016/0121740 A1 | 5/2016 | Zaki | |
| 2019/0285699 A1* | 9/2019 | Weidner | H01M 10/425 |
| 2021/0276425 A1* | 9/2021 | Gauthier | H02J 1/086 |

FOREIGN PATENT DOCUMENTS

| | | |
|---|---|---|
| DE | 102019220422 A1 | 7/2020 |
| EP | 3120434 B1 | 5/2019 |

* cited by examiner

METHOD AND SYSTEM FOR VOLTAGE-BASED DETECTION OF LOSS OF NEUTRAL BETWEEN ON-BOARD CHARGER AND MULTI-PHASE MAINS SUPPLY

CROSS-REFERENCE TO RELATED APPLICATIONS

This application claims the benefit of U.S. Provisional Application No. 63/143,222, filed Jan. 29, 2021, the disclosure of which is hereby incorporated in its entirety by reference herein.

TECHNICAL FIELD

The present invention relates to methods and systems for controlling a multi-phase charger such as a multi-phase, on-board battery charger of an electric vehicle.

BACKGROUND

An on-board battery charger (OBC) of an electric vehicle (EV) is used for charging a traction battery of the EV. The OBC converts electrical power absorbed from an AC power source into DC electrical power and charges the battery with the DC electrical power.

SUMMARY

An object includes a system and a method for controlling an on-board battery charger (OBC) of an electric vehicle (EV) so that the OBC, while receiving electrical power from a charge station (e.g., a mains supply) for charging a traction battery of the EV, stops the charging operation during the presence of an improper voltage condition, such as an overvoltage condition or an undervoltage condition, of the received electrical power.

In carrying out at least one of the above and/or other objects, an OBC is provided. The OBC includes a first rail circuit having a first rail controller, a second rail circuit having a second rail controller, and a main controller in operative communication with the rail controllers. The first rail controller is configured to control operation of the first rail circuit and is further configured to sample a first voltage supplied to the first rail circuit and transmit a fault signal to the main controller upon a comparison between the sampled first voltage and a threshold being affirmative of an improper voltage condition regarding the first voltage. The second rail controller is configured to control operation of the second rail circuit and is further configured to sample a second voltage supplied to the second rail circuit and transmit the fault signal to the main controller upon a comparison between the sampled second voltage and the threshold being affirmative of an improper voltage condition regarding the second voltage. The main controller is configured to control both rail controllers to stop operation of both rail circuits in response to receiving the fault signal from either rail controller. The improper voltage condition may be either an overvoltage condition or an undervoltage condition.

The first voltage may be a first phase voltage supplied from a multi-phase mains supply and the second voltage may be a second phase voltage supplied from the multi-phase mains supply.

The comparison between a sampled voltage and the threshold may require consecutive samples of the sampled voltage compared with the threshold to be affirmative for the comparison to be affirmative.

The OBC may further include a third rail circuit having a third rail controller in operative communication with the main controller. The third rail controller is configured to control operation of the third rail circuit and is further configured to sample a third voltage supplied to the third rail circuit and transmit a fault signal to the main controller upon a comparison between the sampled third voltage and the threshold being affirmative of an improper voltage condition regarding the third voltage. The main controller is further configured to control all of the rail controllers to stop operation of all of the rail circuits in response to receiving the fault signal from any of the rail controllers.

The third voltage may be a third phase voltage supplied from the three-phase mains supply. The comparison between a sampled voltage and the threshold may require at least three consecutive samples of the sampled voltage compared with the threshold to be affirmative for the comparison to be affirmative.

At least one of the comparisons being affirmative may be due to a loss of neutral between the OBC and a mains supply from which the voltages are supplied to the rail circuits, whereby the main controller detects the loss of neutral by receipt of the fault signal. The loss of neutral between the OBC and the mains supply may occur due to a switch connection in an external Electric Vehicle Supply Equipment (EVSE) between a neutral node of the OBC and a neutral line of the mains supply being opened while a switch connection in the EVSE between a voltage node of at least one of the rail circuits and a corresponding voltage line of the OBC is closed.

At least one of the comparisons being affirmative may be due to an instability between the OBC and a mains supply from which the voltages are supplied to the rail circuits, whereby the main controller detects the instability by receipt of the fault signal.

The main controller may be further configured to control all of the rail controllers to resume operation of all of the rail circuits after expiration of a delay following the operation stoppage of the rail circuits and to control all of the rail controllers to stop operation of all of the rail circuits in response to receiving the fault signal from any of the rail controllers subsequent to the operation of all of the rail circuits being resumed.

The OBC may be on-board an electric vehicle and may be used for charging a traction battery of the electric vehicle.

Further, in carrying out at least one of the above and/or other objects, a method for use with an OBC is provided. The OBC includes a first rail circuit having a first rail controller, a second rail circuit having a second rail controller, and a main controller in operative communication with the rail controllers. The first rail controller is configured to control operation of the first rail circuit and the second rail controller is configured to control operation of the second rail circuit. The method includes the first rail controller sampling a first voltage supplied to the first rail circuit and transmitting a fault signal to the main controller upon a comparison between the sampled first voltage and a threshold being affirmative of an improper voltage condition regarding the first voltage. The method further includes the second rail controller sampling a second voltage supplied to the second rail circuit and transmitting the fault signal to the main controller upon a comparison between the sampled second voltage and the threshold being affirmative of an improper voltage condition regarding the second voltage. At least one of the comparisons between the sampled voltages and the threshold is affirmative whereby at least one of the rail controllers transmits the fault signal to the main controller. The method further includes the main controller, in response to receiving the fault signal, controlling both rail controllers to stop operation of both rail circuits.

Also, in carrying out at least one of the above and/or other objects, another OBC is provided. This OBC includes a first rail circuit, a second rail circuit, and a controller. The controller is configured to sample a first voltage supplied to the first rail circuit and stop operation of both rail circuits upon a comparison between the sampled first voltage and a threshold being affirmative of an improper voltage condition regarding the first voltage.

DETAILED DESCRIPTION

Detailed embodiments of the present invention are disclosed herein; however, it is to be understood that the disclosed embodiments are merely exemplary of the present invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
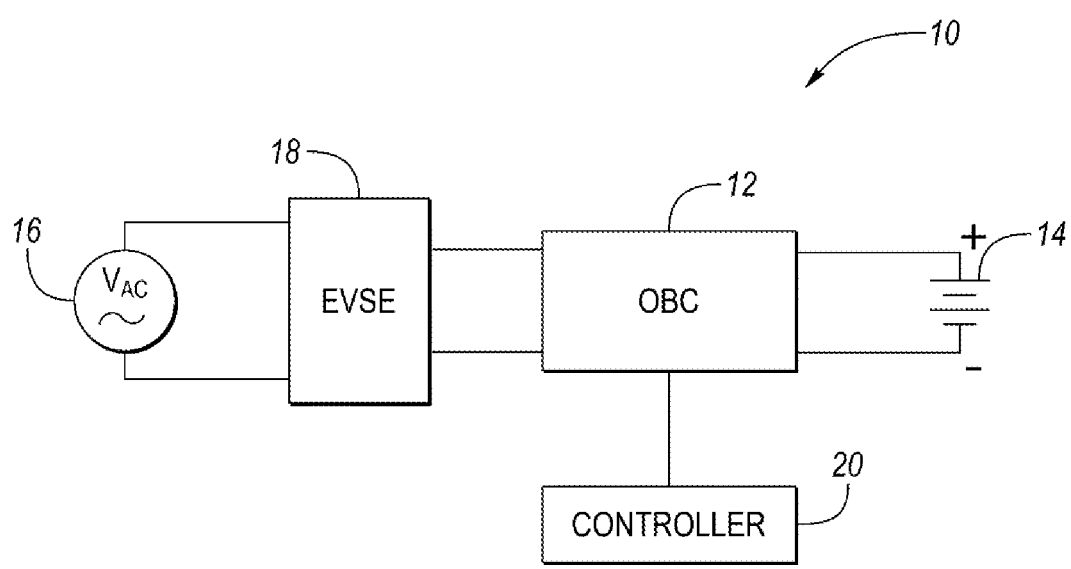
FIG. 1 illustrates a block diagram of an electrical system having a multi-phase (or multi-rail), on-board battery charger (OBC)

Referring now to FIG. 1, a block diagram of an electrical system 10 having an on-board battery charger (OBC) 12 is shown. OBC 12 is "on-board" an electric vehicle (EV). The terms "electric vehicle" and "EV" herein encompass any type of vehicle which uses electrical power for vehicle propulsion including battery-only electric vehicles (BEV), hybrid electric vehicles (HEV), plug-in hybrid electric vehicles (PHEV), and the like. OBC 12 is used for charging a traction battery 14 of the EV. Traction battery 14 is a high-voltage (HV) direct current (DC) traction battery per electrical energy requirements for vehicle propulsion.

Electrical system 10 further includes an alternating current (AC) power source such as a mains supply 16 of the electrical grid. OBC 12 charges traction battery 14 using electrical power from mains supply 16. OBC 12 connects to mains supply 16 via an external Electric Vehicle Supply Equipment (EVSE) 18 to absorb electrical power from the mains supply. OBC 12 converts electrical power absorbed from mains supply 16 into DC electrical power. OBC 12 outputs the DC electrical power via a HV DC bus of the vehicle to traction battery 14 for charging the traction battery.

A main controller ("controller") 20 is associated with OBC 12. Controller 20 is an electronic device such as a processor, micro-controller, or the like (e.g., a computer) on-board the EV (e.g., a vehicle controller). Controller 20 is in communication with OBC 12 to control operations of the OBC. Controller 20 controls OBC 12 in converting electrical power from mains supply 16 into DC electrical power and in charging traction battery 14 with the DC electrical power. Controller 20 may be integrated inside the OBC unit. Controller 20 may provide general commands and communication with other vehicle units and phase (rail) dedicated controllers (discussed below) in charge of phase (rail) operation, control, and diagnostics in real time. Controller 20 is also operable to communicate and control other nodes of electrical system 10 and the EV including nodes involved in the charging applications.

Figure 2:
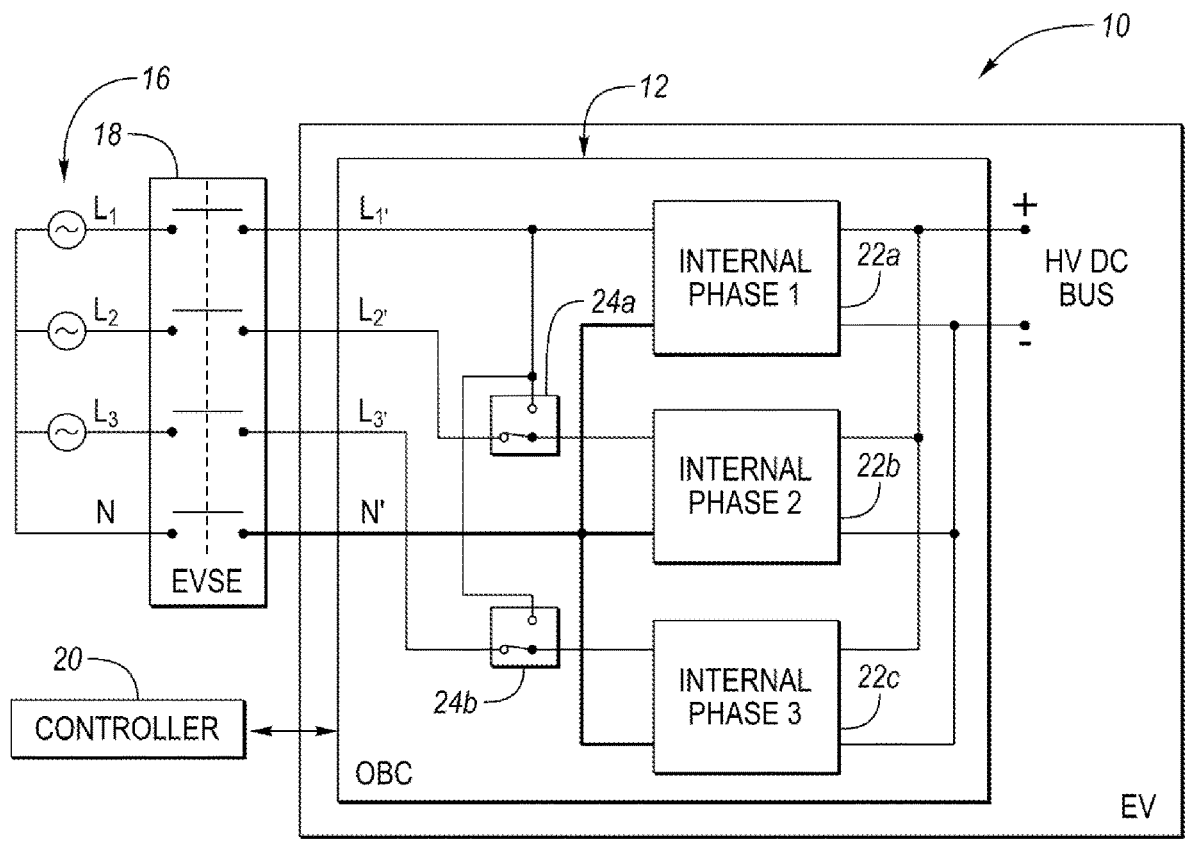
FIG. 2 illustrates a block diagram of the electrical system with a detailed depiction of the OBC as a three-phase (or three-rail) OBC having three phases (or rails) and further having input relays between the rails.

Referring now to FIG. 2, with continual reference to FIG. 1, a block diagram of electrical system 10 with a detailed depiction of OBC 12 is shown. OBC 12 is a N-phase (or N-rail) OBC, where N is an integer greater than one. As such, OBC 12 is a multi-phase (or multi-rail) OBC having at least two phases (or rails) (i.e., branches, etc.). For example, as shown in FIG. 2, OBC 12 is a three-phase (or three-rail) OBC having first, second, and third rails 22a, 22b, and 22c (collectively, "rails 22") (each labeled "Internal Phase" in FIG. 2).

Rails (i.e., rail circuits) 22 have the same electrical circuitry for converting electrical power from mains supply 16 into DC electrical power for charging traction battery 14. For example, each rail 22a, 22b, and 22c has an AC electromagnetic interference (EMI) input filter followed serially by a power factor corrector (PFC), a DC link capacitor, a DC/DC converter, and an output filter (not shown). Controller 20 in conjunction with rail controllers (discussed below) of rails 22 controls the operation of the electrical circuitry of rails 22 in converting electrical power from mains supply 16 into DC electrical power and in delivering the DC electrical power to traction battery 14. More particularly, in embodiments, a "Main Controller" is internal to the OBC and three "internal phase controllers" (or "rail controllers") are respectively associated with the three rails 22. The combination of these four controllers may be understood as providing the "controller" functionality.

Each rail 22a, 22b, and 22c is to be connected to mains supply 16 via EVSE 18 for that rail to absorb electrical power from the mains supply and to convert the absorbed electrical power into DC electrical power for charging traction battery 14. Rails 22 are connected in parallel between the input of the OBC, which connects to mains supply 16 via EVSE 18, and the output of the OBC, which connects to traction battery 14 via the HV DC bus of the vehicle.

Strictly as an example, each rail 22a, 22b, and 22c can deliver 3.6 kW of electrical power for charging traction battery 14. As such, in this example, OBC 12 can deliver 10.8 kW (3*3.6 kW) of electrical power for charging traction battery 14 (i.e., in this example, OBC 12 is a "11 kW" OBC).

OBC 12 further includes input relays 24a and 24b (collectively, "input relays 24"). Input relay 24a is between the inputs of rails 22a and 22b. Input relay 24b is between the inputs of rails 22a and 22c. Each input relay 24a and 24b is switchable between opened and closed states. Controller 20 is operable to control the switching of input relays 24.

A closed input relay connects the inputs of the two rails that the input relay is between. Conversely, an opened input relay disconnects the two rails that the input relay is between. Input relays 24 are both shown in FIG. 2 in an opened state. Thus, the input of rail 22b is not connected to the input of rail 22a as input relay 24a between rails 22a and 22b is opened. Likewise, rail 22c is not connected to the input of rail 22a as input relay 24b between rails 22a and 22c is opened.

Input relays 24 are for use in enabling OBC 12 to be used interchangeably with a single-phase mains supply and a multi-phase mains supply. Rail 22a individually connects directly to mains supply 16 via EVSE 18 in either case of the mains supply being single-phase or multi-phase. In the case of mains supply 16 being a single-phase, controller 20 controls input relays 24 to be closed. In this case, rails 22b and 22c are combined with rail 22a to be connected with rail 22a to mains supply 16. In the case of mains supply 16 being multi-phase, controller 20 controls input relays 24 to be opened. In this case, in addition to rail 22a being individually connected directly to mains supply 16 via EVSE 18, rails 22b and 22c are also individually connected directly to the mains supply via the EVSE.

In embodiments of the present invention, mains supply 16 is a three-phase mains supply. OBC 12 is a three-phase (i.e., three rail) OBC in correspondence with mains supply 16 being a three-phase mains supply. As OBC 12 is a three-rail OBC, input relays 24a and 24b are both opened and all three rails 22 of OBC 12 individually directly connect with mains supply 16 via EVSE 18. Particularly, each rail 22a, 22b, 22c directly connects, via respective nodes $L_{1'}$, $L_{2'}$, $L_{3'}$ of OBC 12, with a corresponding line $L_1$, $L_2$, $L_3$ of mains supply 16 and, via a neutral node N' of the OBC, with a neutral line N of the mains supply.

As described, OBCs for EVs that are capable to work with single-phase (1-ph) and three-phase (3-ph) AC grids with N (neutral) available are usually designed with three internal rails (or modules) 22 which share the neutral node N' of the OBC. Rails 22b and 22c can switch to the $L_{1'}$ node of the OBC in the case of 1-ph AC grids. As further described, the OBCs are not directly connected to the electrical grid but are connected to the electrical grid by means of an EVSE. The EVSE acts as an additional element to ensure a safe and controlled connection of the OBC to the AC grid. When both the EVSE and the OBC are ready for the charging operation, the EVSE closes its contactors and the OBC receives the AC voltage supply from the AC grid.

Figure 3:
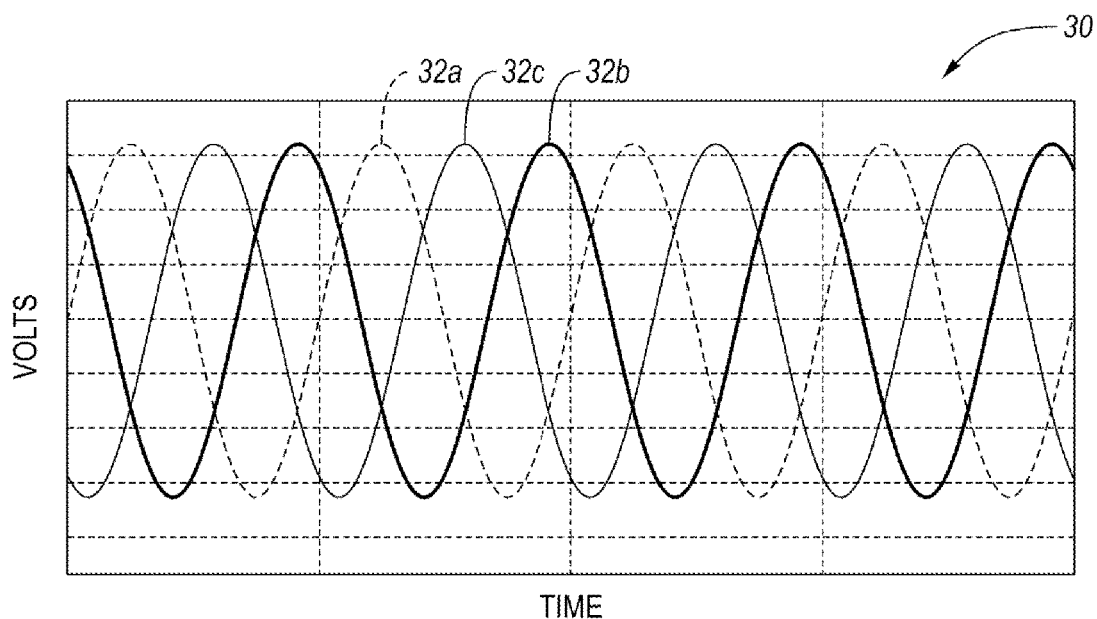
FIG. 3 illustrates a graph having plots of first-phase, second-phase, and third-phase AC voltages respectively supplied from a three-phase mains supply of the electrical system to the first, second, and third rails of the OBC when the OBC and the mains supply are operating properly together.

Referring now to FIG. 3, with continual reference to FIGS. 1 and 2, a graph 30 having plots of first-phase AC voltage 32a (vL1N), second-phase AC voltage 32b (vL2N), and third-phase AC voltage 32c (vL3N) respectively supplied from three-phase mains supply 16 to first rail 22a, second rail 22b, and third rail 22c of OBC 12 is shown. As shown in graph 30, AC voltages 32 are phase-shifted from one another by 120° and have the same sinusoidal shape with the same peak amplitudes. Thus, graph 30 represents when OBC 12 and mains supply 16 are properly operating together. The operation between OBC 12 and mains supply 16 is proper as corresponding switches of EVSE 18 are properly closed to thereby connnect nodes $L_{1'}$, $L_{2'}$, $L_{3'}$, N' of the OBC with corresponding lines $L_1$, $L_2$, $L_3$, N of the mains supply.

Figure 4:
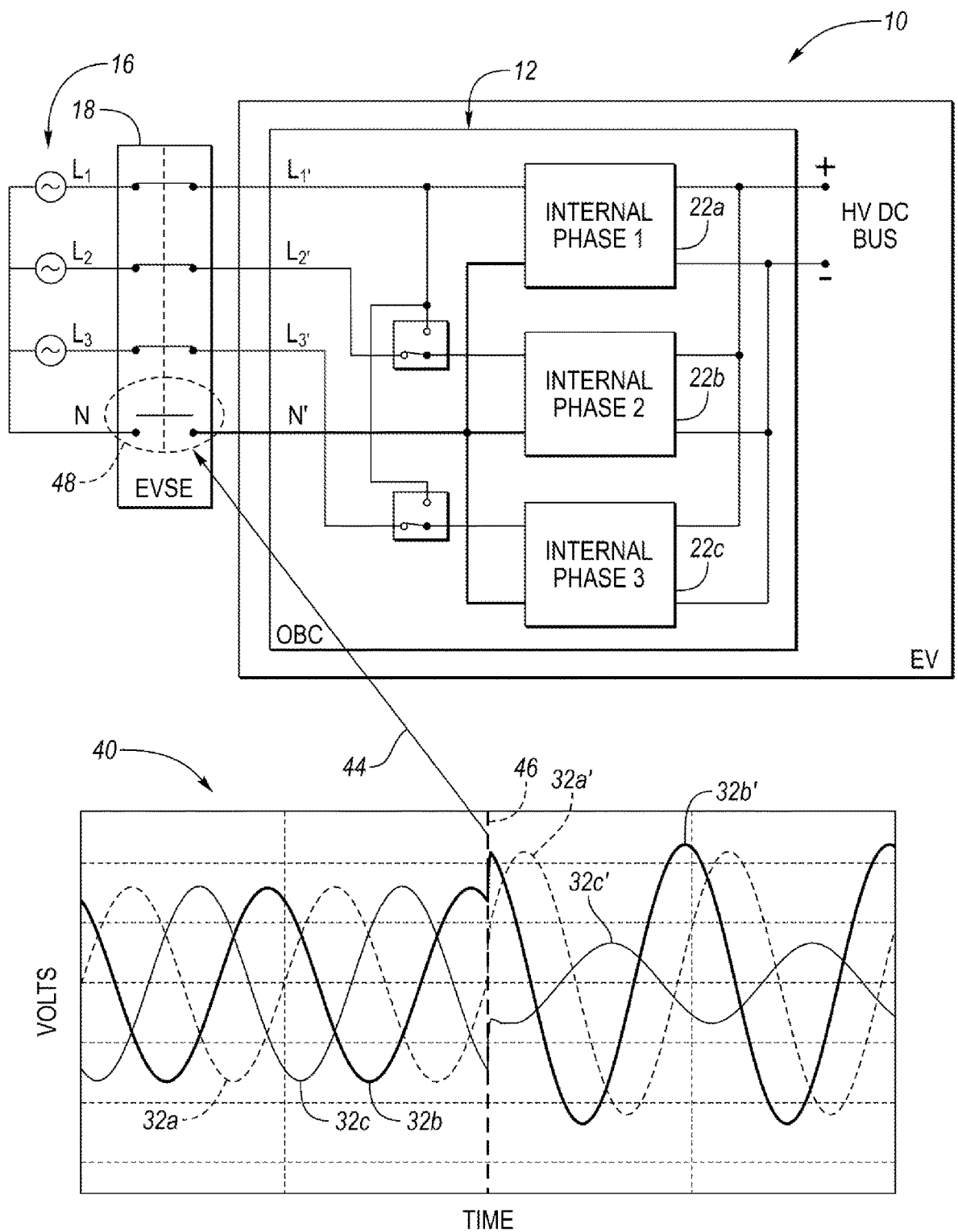
FIG. 4 illustrates the block diagram of the electrical system as shown in FIG. 2 and a graph having (i) plots of the three AC voltage phases respectively supplied from the mains supply to the three rails of the OBC when the OBC and the mains supply are operating properly together followed by (ii) plots of the three AC voltage phases respectively supplied from the mains supply to the three rails of the OBC when a loss of neutral exists between the OBC and the mains supply.

Referring now to FIG. 4, with continual reference to FIGS. 1, 2, and 3, a block diagram of electrical system 10 as shown in FIG. 2 and a graph 40 of plots of the AC voltages supplied from mains supply 16, with respect to the internal N' point of OBC 12, to the OBC are shown. Graph 40 has (i) plots of the three AC voltage phases 32a, 32b, 32c respectively supplied from mains supply 16 to the three rails 22a, 22b, 22c of OBC 12 when the OBC and the mains supply are operating properly together followed by (ii) plots of the three phase AC voltages 32a', 32b', 32c' respectively supplied from the mains supply to the three rails 22a, 22b, 22c of the OBC when a loss of neutral exists between the OBC and the mains supply.

The loss of neutral between OBC 12 and mains supply 16 occurs due to the switch connection in EVSE 18 between neutral node N' of OBC 12 and neutral line N of mains supply 16 becoming opened while the switch connections in the EVSE between one or more of nodes $L_{1'}$, $L_{2'}$, $L_{3'}$ of the OBC and corresponding lines $L_1$, $L_2$, $L_3$ of the mains supply are closed. This loss of neutral is indicated in FIG. 4 by line 44 which indicates in graph 40 the time instant, indicated by dotted line 46 in graph 40, when the loss of neutral occurs and which line 44 further indicates in the block diagram of electrical system 10 that this loss of neutral occurs due to the switch in EVSE 18 between neutral node N' of OBC 12 and neutral line N of mains supply 16 being opened, as indicated by dotted circle 48. As further shown in FIG. 4, in this example, the switch connections in the EVSE between all of nodes $L_{1'}$, $L_{2'}$, $L_{3'}$ of the OBC and corresponding lines $L_1$, $L_2$, $L_3$ of the mains supply are closed.

The depiction in FIG. 4, in which EVSE 18 opens the neutral contactor (N) before the line contactors (Lx), occurs with some OBCs. This implies that if during an emergency stop where EVSE 18 decides to open its contactors while OBC 12 is still processing power, then it is likely that the internal rails $L_{1'}$, $L_{2'}$, $L_{3'}$ to the internal neutral node N' voltages start fluctuating because the electrical grid (i.e., mains supply 16) is no longer imposing the line-to-neutral voltage anymore. Hence, the input voltage of each internal rail 22 of OBC 12 can increase up to 1.73 times the amount that the internal rails are designed for and may therefore damage the OBC. The unbalanced situation in case of having the internal neutral N' floating implies that those rails (for example, rails 22a and 22b) working at lower power conditions will see their input voltages Lx'-N' increase (for example, AC voltages 32a' and 32b' as shown in graph 40—depictive of an overvoltage condition of input voltage $L_1'$-N' and of input voltage $L_2'$-N') while those working at higher power conditions (for example, rail 22c) will see their input voltages Lx'-N' decrease (for example, AC voltage 32c' as shown in graph 40—depictive of an undervoltage condition of input voltage $L_3'$-N'). This means that it is not possible to execute selective stops in those internal rails that are seeing too much input voltage because it would make the situation worse.

Hence, it is desired to make a smart stop on all rails 22 to ensure OBC 12 stops processing in all rails at the same time so as to not damage any component in case of a sustained improper input voltage condition (i.e., in case of a sustained input overvoltage or undervoltage condition). This could be done if the controller of all rails 22 was common, but because of cost and to respect functional isolation between rails, each internal rail is generally controlled by its own independent "rail controller" which only sees what is happening on its own rail.

In sum, the description above pertaining to FIGS. 2, 3, and 4 involves loss-of-neutral protection in multi-phase OBCs. Loss-of-neutral is an issue to solve in the charging mode. In normal conditions, L1, L2, and L3 phase voltages are relative to Neutral. But Neutral may be lost when the EVSE opens the N relay first at disconnection, or due to grid instabilities. Without the Neutral reference, the L1, L2, and L3 phase voltages change such as due to environmental factors. A relatively short time, such as 200 milliseconds, in this condition may cause damage. The OBC is to detect this anomaly and react fast in order to avoid such damage.

Figure 5:
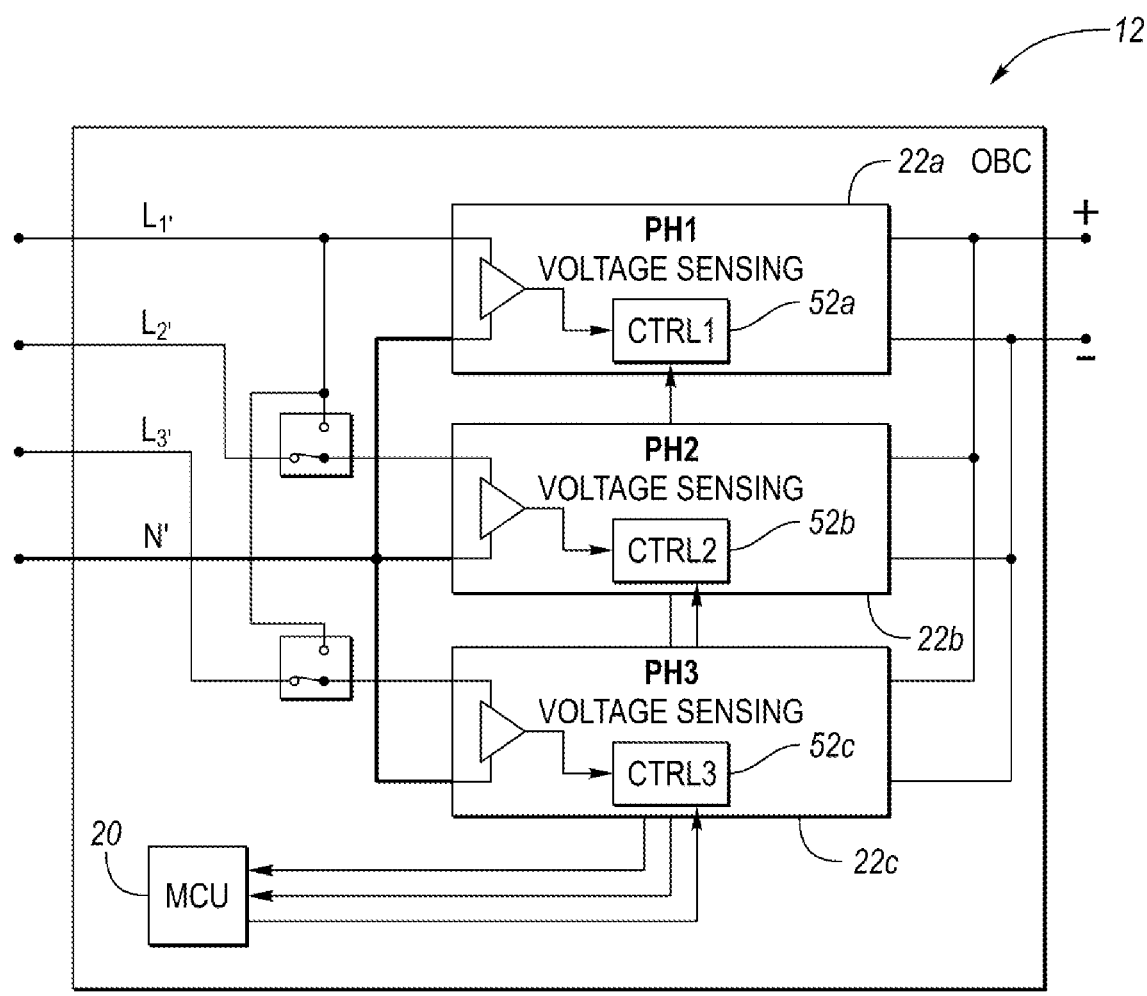
FIG. 5 illustrates a block diagram of the OBC with a depiction of individual controllers of the rails of the OBC and their communicative arrangement with a master controller of the OBC.

Referring now to FIG. 5, with continual reference to the preceding Figures, a block diagram of OBC 12 is shown. In this block diagram, the individual controllers 52a ("CTRL1"), 52b ("CTRL2"), 52c ("CTRL3") (collectively, "rail controllers 52") of rails 22a, 22b, 22c, respectively, of OBC 12 and their communicative arrangement with controller 20 ("MCU") of the OBC are shown.

In accordance with embodiments of the present invention, information from rail controllers 52 is received by the OBC supervisor MCU (i.e., controller 20) which is also the controller that is responsible to command the rail controllers what to do. In operation, each rail controller 52a, 52b, 52c provides controller 20 with a signal indicative of the input voltage received by its corresponding rail 22a, 22b, 22c from mains supply 16. Controller 20 in case of seeing a sustained improper voltage (i.e., sustained overvoltage or undervoltage) on one or more of rails 22 commands all the rails together to stop processing power. At that moment, all input voltages would come back to "normal" as the system recovers a naturally balanced condition. That is why, further in accordance with embodiments of the present invention, a retry strategy to resume charging in order to certify that the sustained improper voltage condition was actually given by a loss of the neutral node and set the corresponding DTC (diagnostic trouble code) may be additionally deployed.

Figure 6:
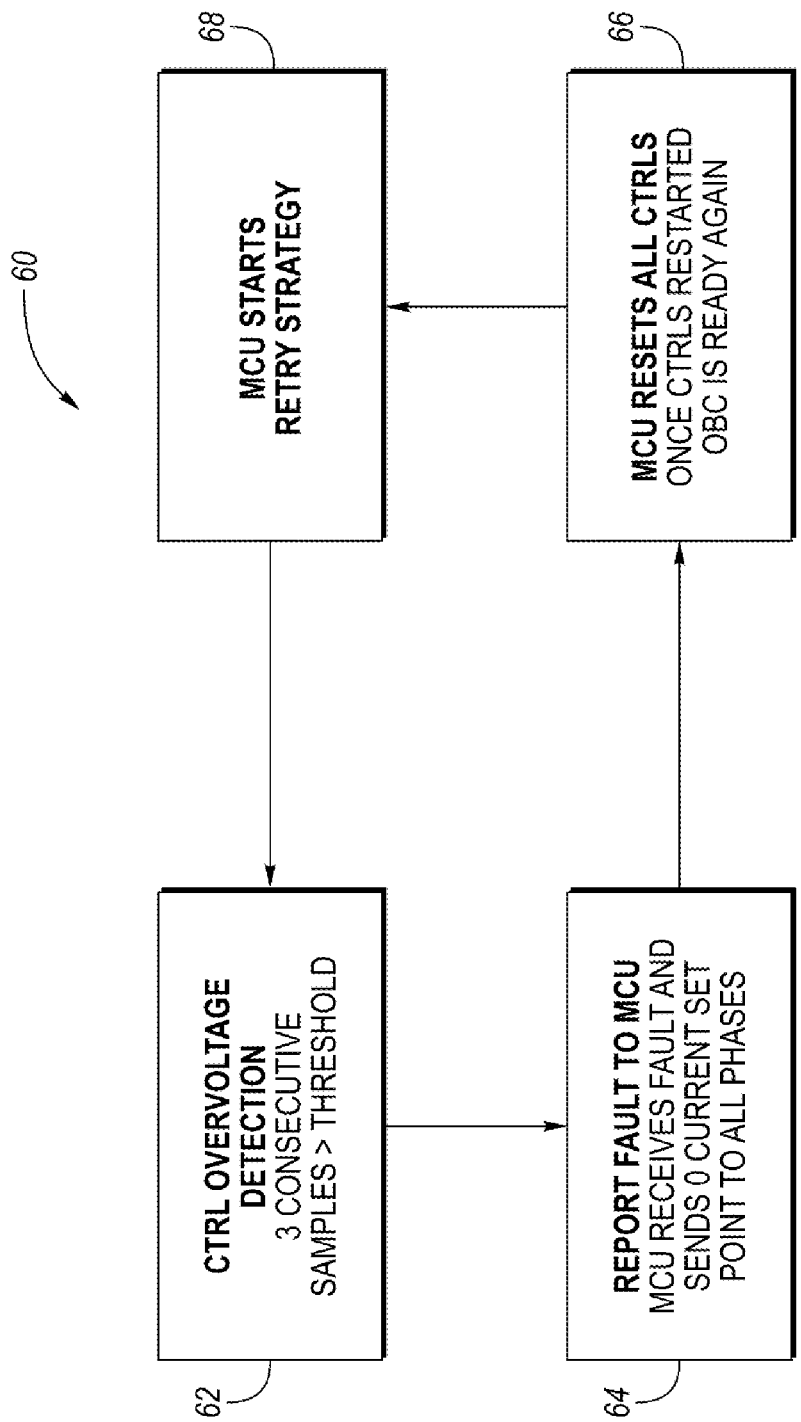
FIG. 6 illustrates a flowchart depicting operation of a method and system for voltage-based detection of loss of neutral between the OBC and the mains supply.

Referring now to FIG. 6, with continual reference to FIG. 5, a flowchart 60 depicting operation of a method and system for voltage-based detection of loss of neutral between OBC 12 and mains supply 16 in accordance with embodiments of the present invention is shown. With reference to block 62 "CTRL overvoltage detection" of flowchart 60, the operation includes rail controllers 52 sampling the AC voltages supplied to the inputs of their associated rails 22, comparing the sampled AC voltages with an overvoltage threshold, and transmitting a fault signal to controller 20 upon the sampled AC voltages being greater than the overvoltage threshold. For instance, rail controller 52a of rail 22a samples at a given instant the AC voltage supplied to rail 22a, compares the AC voltage sample with the overvoltage threshold, and transmits a fault signal to controller 20 when the AC voltage sample is greater than the overvoltage threshold. (Of course, the operation depicted in flowchart 60 may involve an undervoltage threshold in place of the overvoltage threshold.)

In an embodiment, rail controllers 52 transmit a fault signal to controller 20 when three consecutive AC voltage samples are greater than the overvoltage threshold. For instance, with reference to block 62, when three consecutive AC voltage samples of a rail 22, each taken at, for instance, 100 microseconds by rail controller 52 of that rail 22, is greater than an overvoltage threshold of, for instance, 380 Vpk, then that rail controller 52 transmits a fault signal to controller 20. Of course, this is just an example as any predetermined sampling interval other than 100 microseconds and/or any predetermined overvoltage threshold of 380 Vpk can be used in the determination of a fault signal. (It is noted that to be compatible with more AC voltages, the overvoltage threshold may be a variable threshold that is calculated each time before a Charge (or Charge Retry) is started (e.g., Overvoltage Threshold=(AC voltage RMS*1.735)) (the "1.73" factor has been referred above). It is further noted that the overvoltage threshold may be limited/saturated, such as to 399 Vpk to avoid OBC input damage (at the TVS component, explained below.)

With reference to block 64 "Report FAULT to MCU" of flowchart 60, the operation further includes controller 20 receiving a fault signal from a rail controller 52 in response to that rail controller detecting an overvoltage condition at rail 22 of OBC 12 to which that rail controller belongs. In response to receiving the fault signal, controller 20 commands all rails 22 to stop processing power. For instance, as shown by block 64, controller 20 sends a zero current set point to all rails 22 in response to receiving a fault signal from a rail controller 52. Sending a zero current set point is equivalent to controller 20 indicating to phases 22 to stop processing power.

With reference to block 66 "MCU resets all CTRLs" of flowchart 60, the operation further includes controller 20 resetting all rail controllers 52. As shown by block 66, once rail controllers 52 are restarted, rails 22 of OBC 12 are ready again to absorb electrical power from mains supply 16 and to convert the absorbed electrical power into DC electrical power for charging traction battery 14.

With reference to block 68 "MCU starts retry strategy" of flowchart 60, the operation further includes controller 20 starting a retry strategy following a delay after the controller 20 resets rail controllers 52. Normally, ground loss is not detected until the rail starts working again (energy flow). Then, after a series of "loss-of-neutral" fault cycles, controller 20 may set a permanent loss-of-neutral fault status and stop retrying. If the permanent fault is due to a rail controller 52 malfunction, it has nothing to do with this anomaly detection. It is noted that when a rail controller 52 is set to "permanent fault", due to reaching a maximum failure attempts (e.g., five), controller 20 disables the affected rail controller 52 and the communication between them is disabled. Consequently, this disabled rail controller 52 will not report to controller 20 its AC voltage nor new failures (due to it being disabled) and controller 20 will use information from less rails 22/rail controllers 52.

Figure 7A:
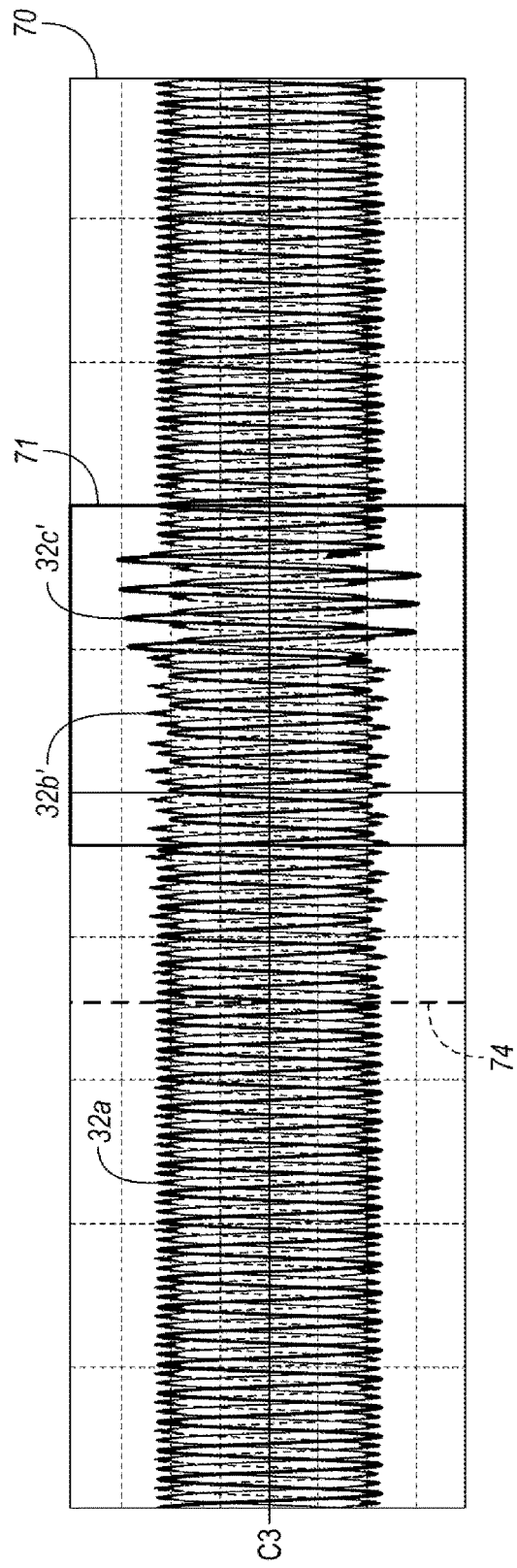
FIG. 7A illustrates a graph having plots of the three AC voltage phases respectively supplied from the mains supply to the OBC according to experimental results.
Figure 7B:
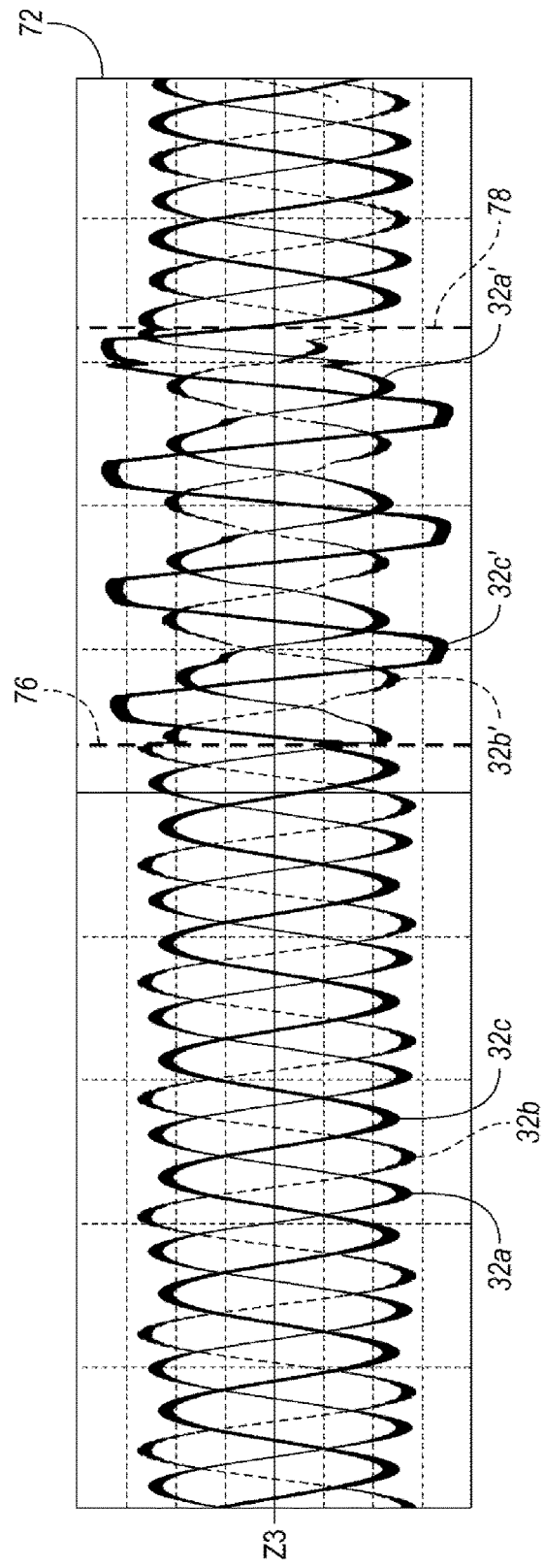
FIG. 7B illustrates a graph of a magnified portion of the graph shown in FIG. 7A.

Referring now to FIGS. 7A and 7B, with continual reference to FIGS. 5 and 6, a graph 70 (shown in FIG. 7A) and a graph 72 (shown in FIG. 7B) of a magnified portion 71 of graph 70 having plots of the three AC voltage phases respectively supplied from mains supply 16, with respect to the internal N' point of OBC 12, to the OBC according to experimental results are shown. Particularly, graphs 70 and 72 both have (i) plots of the three AC voltage phases 32a, 32b, 32c respectively supplied from mains supply 16 to the three rails 22a, 22b, 22c of OBC 12 when the OBC and the mains supply are operating properly together and (ii) plots of the three phase AC voltages 32a', 32b', 32c' respectively supplied from the mains supply to the three rails 22*a*, 22*b*, 22*c* of the OBC when a loss of neutral exists between the OBC and the mains supply.

According to this experiment, initially, OBC 12 and mains supply 16 are operating properly together with all rails 22 of the OBC working more or less with the same power. A loss of neutral between OBC 12 and mains supply 16 then occurs at a given time, indicated by dotted line 74 in graph 70. Rails 22 then start unbalancing due to the loss of neutral. During an initial time period while rails 22 are unbalancing, none of AC voltage phases supplied to rails 22 of OBC 12 are greater than the overvoltage threshold (or at least no consecutive three samples of an AC voltage phase supplied to a rail 22 is detected by rail controller 52 of that rail 22 as being greater than the overvoltage threshold as described above).

At a subsequent time, indicated by dotted line 76 in graph 72, an important un-balanced situation is reached (i.e., the unbalancing of rails 22 has reached an actionable level) (input stages risky un-balance). This important un-balanced situation is reached due to an AC voltage phase supplied to a rail 22 of OBC 12 becoming greater than the overvoltage threshold (or at least three consecutive samples of the AC voltage phase supplied to a rail 22 is detected by rail controller 52 of that rail 22 as being greater than the overvoltage threshold). Particularly, according to these experimental results, the important un-balanced situation is reached due to AC voltage phase 32*c'* supplied to rail 22*c* of OBC 12 becoming greater than the overvoltage threshold (or at least three consecutive samples of AC voltage phase 32*c'* is greater than the overvoltage threshold).

In response to the comparison between AC voltage phase 32*c'* and the overvoltage threshold being affirmative, rail controller 52*c* transmits to controller 20 a fault signal indicative of a sustained overvoltage on rail 22*c*. The voltage clamping on the top and bottom is an indicator that the input transient voltage suppressor (TVS) is being activated as a consequence of the loss of neutral (LoN). If the situation is not stopped, then it may end up failing in short circuit and damage OBC 12. (To be clear, embodiments of the present invention also envision the alternative of sensing at the negative peaks, with negative threshold and negative overvoltage, being done for the comparisons involving AC voltage phases. A sensing of "smaller" AC voltage phase signals relative to a threshold could also be indicative of a loss of neutral.)

In response to receiving the fault signal from rail controller 52*c*, controller 20 commands all rails 22 to stop processing power. According to these experimental results, controller 20 transmits to rail controllers 52 of rails 22 a stop processing power command signal after three consecutive samples of AC voltage phase 32*c'* is greater than the overvoltage threshold. In response to receiving the stop processing power command, rail controllers 52 control their rails 22 to stop processing power. All rails 22 are then stopped, at a time instant indicated by dotted line 78 (controller 20 stops charging operation), and the AC voltage phases then come back to normal.

Figure 8:
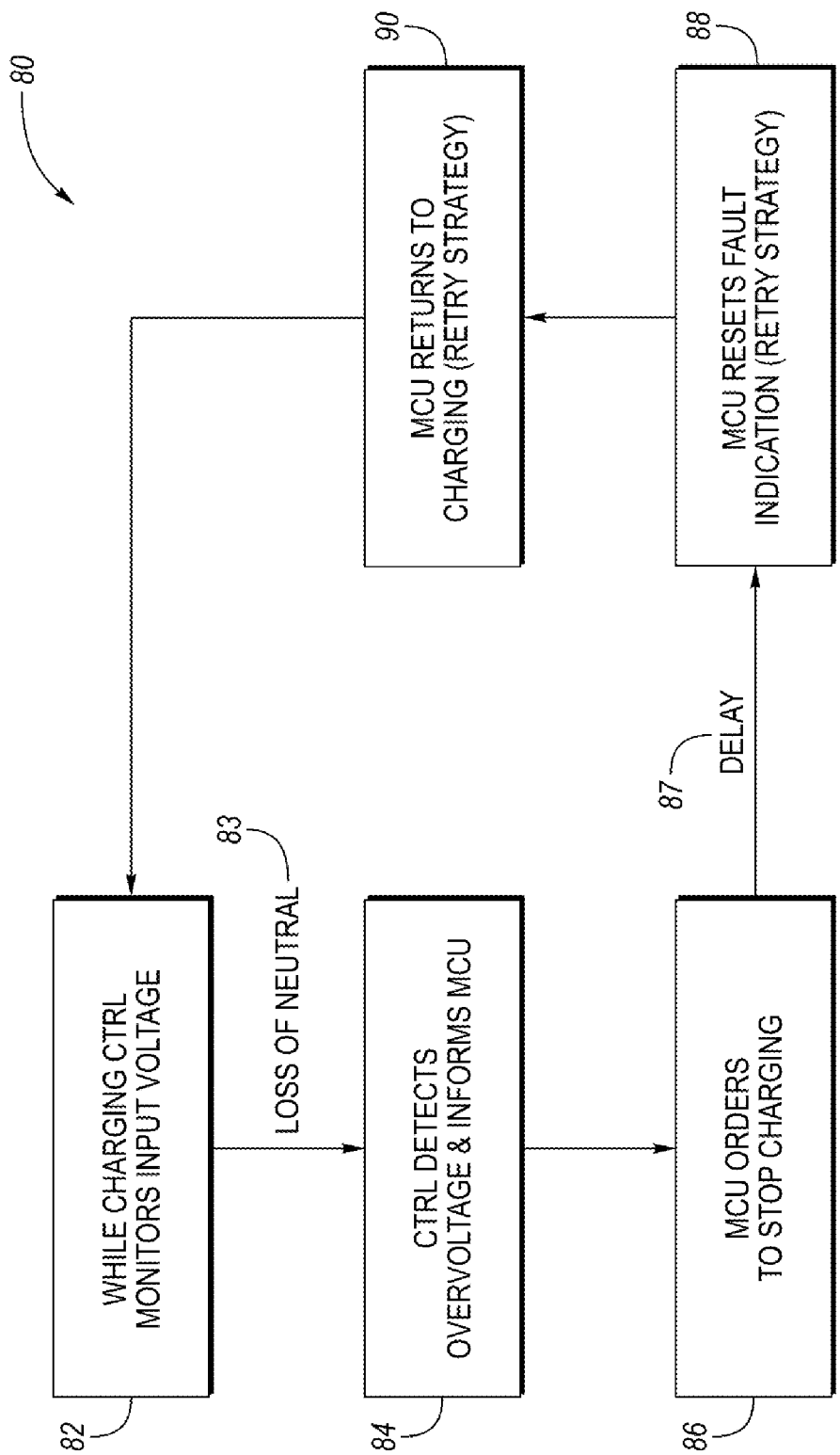
FIG. 8 illustrates another flowchart depicting operation of a method and system for voltage-based detection of loss of neutral between the OBC and the mains supply.

Referring now to FIG. 8, with continual reference to FIG. 5, another flowchart 80 depicting operation of a method and system for voltage-based detection of loss of neutral between OBC 12 and mains supply 16 is shown. As will be discussed, the operation includes a retry strategy for retrying operation of OBC 12 after stopping operation of the OBC following a loss of neutral. The operation begins while OBC 12 is receiving AC electrical energy from mains supply 16 for charging traction battery 14. During the charging, rail controllers 52 monitor the input voltages of their rails 22, as indicated in block 82. That is, the input voltage at each rail 22*a*, 22*b*, and 22*c* is monitored by the respective rail controller 52*a*, 52*b*, and 52*c*. A loss of neutral condition then occurs, as indicated by reference numeral 83. Due to the loss of neutral condition, a rail controller 52 detects an overvoltage condition at its rail 22 and informs controller 20 with the fault signal, as indicated in block 84. In response to receiving the fault signal, controller 20 orders all rail controllers 52 to stop operation of their rails 22, as indicated in block 86. That is, overvoltage at each rail may be reported to controller 20 which will then stop the charging operation.

After a delay, as indicated in block 87, controller 20 resets the fault indication (retry strategy) to rail controllers 52, as indicated in block 88. Controller 20 and rail controllers 52 then function to resume the charging (retry strategy), as indicated in block 90. That is, the retry strategy is initiated in case the anomaly disappears.

As described, many OBCs intended to operate with 1-ph or 3-ph AC grids are based on three internal rails which share the neutral node and the expectation of these OBCs is to be connected to AC grids with N available (star configuration type of grids). The OBCs are to be robust against the loss or the lack of the neutral node from the grid to avoid potential damage. The EVSE can open the N contactor while charging and this may result in harmful voltages at the input of one or more of the internal rails of the OBC. A similar situation could be given in the case that the grid does not actually have neutral node available (such as triangle configuration type of grids).

As described, embodiments of the present invention provide an effective way to detect and protect 3-ph OBCs against the loss or the lack of neutral node. Embodiments of the present invention may implement the detection and protection of 3-ph OBCs against the loss or the lack of neutral node using software in the OBC digital controllers (i.e., rail controllers 52) and in the MCU (i.e., controller 20) so the solution is relatively free of additional cost. Embodiments of the present invention thereby avoid the use of an additional analog isolator amplifier that provides the input voltages of the rails of the OBC to the MCU. Embodiments of the present invention may also be applicable to the arrangement in which only one controller directly manages the three rails of the OBC.

As described, a brief description of embodiments of the present invention includes in 3-phase AC grid charging, OBC protection in case of loss of Neutral connection; this anomaly may happen either because of grid instability (e.g., temporal grid anomalies) or due to EVSE opening N relay prior to L1-L3 relays opening at disconnection. New features of embodiments of the present invention include existing input voltage monitoring stages are used to detect overvoltage (or undervoltage) fault condition; fault is transferred to main microcontroller that commands a charging stop; reaction time shorter than 200 milliseconds to avoid damage to input stages; retry strategy, after a given delay, to recover charging in case of temporal loss of Neutral connection or temporal grid instability; and only software algorithm added. A problem solved by embodiments of the present invention includes Loss-of-Neutral fault might damage OBC input stages. A technology to which embodiments of the present invention provide an improvement over includes direct sensing with additional components which might be faster but would be more expensive and require larger PCB area.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An on-board battery charger (OBC), comprising:
a first rail circuit comprising a first rail controller;
a second rail circuit comprising a second rail controller;
a main controller in operative communication with the rail controllers,
wherein the first rail controller is configured to control operation of the first rail circuit and is further configured to sample a first voltage supplied to the first rail circuit and transmit a first fault signal to the main controller upon a comparison between the sampled first voltage and a threshold being affirmative of an improper voltage condition regarding the first voltage,
the second rail controller is configured to control operation of the second rail circuit and is further configured to sample a second voltage supplied to the second rail circuit and transmit a second fault signal to the main controller upon a comparison between the sampled second voltage and the threshold being affirmative of an improper voltage condition regarding the second voltage, and
the main controller is configured to control both rail controllers to stop operation of both rail circuits in response to receiving the first fault signal or the second fault signal from either of the first rail controller or the second rail controller.

2. The OBC of claim 1, wherein:
the improper voltage condition is either an overvoltage condition or an undervoltage condition.

3. The OBC of claim 1, wherein:
the comparison between a sampled voltage and the threshold requires consecutive samples of the sampled voltage compared with the threshold to be affirmative for the comparison to be affirmative.

4. The OBC of claim 1, further comprising:
a third rail circuit comprising a third rail controller;
wherein the main controller is further in operative communication with the third rail controller,
the third rail controller is configured to control operation of the third rail circuit and is further configured to sample a third voltage supplied to the third rail circuit and transmit a third fault signal to the main controller upon a comparison between the sampled third voltage and the threshold being affirmative of an improper voltage condition regarding the third voltage, and
the main controller is further configured to control all of the rail controllers to stop operation of all of the rail circuits in response to receiving the first fault signal, the second fault signal or the third fault signal from any of the rail controllers.

5. The OBC of claim 4, wherein:
the first voltage is a first phase voltage supplied from a three-phase mains supply, the second voltage is a second phase voltage supplied from the three-phase mains supply, and the third voltage is a third phase voltage supplied from the three-phase mains supply.

6. The OBC of claim 1, wherein:
the first voltage is a first phase voltage supplied from a multi-phase mains supply and the second voltage is a second phase voltage supplied from the multi-phase mains supply.

7. The OBC of claim 1, wherein:
at least one of the comparisons being affirmative is due to a loss of neutral between the OBC and a mains supply from which the voltages are supplied to the rail circuits, whereby the main controller detects the loss of neutral by receipt of the first fault signal or the second fault signal.

8. The OBC of claim 7, wherein:
the loss of neutral between the OBC and the mains supply occurs due to a switch connection in an external Electric Vehicle Supply Equipment (EVSE) between a neutral node of the OBC and a neutral line of the mains supply being opened while a switch connection in the EVSE between a voltage node of at least one of the rail circuits and a corresponding voltage line of the OBC is closed.

9. The OBC of claim 1, wherein:
at least one of the comparisons being affirmative is due to an instability between the OBC and a mains supply from which the voltages are supplied to the rail circuits, whereby the main controller detects the instability by receipt of the first fault signal or the second fault signal.

10. The OBC of claim 1, wherein:
the main controller is further configured to control all of the rail controllers to resume operation of all of the rail circuits after expiration of a delay following the operation of all of the rail circuits being stopped, and
the main controller is further configured to control all of the rail controllers to stop operation of all of the rail circuits in response to receiving the first fault signal or the second fault signal from any of the rail controllers subsequent to the operation of all of the rail circuits being resumed.

11. The OBC of claim 1, wherein:
the OBC is on-board an electric vehicle and is used for charging a traction battery of the electric vehicle.

12. A method for use with an on-board battery charger (OBC) including a first rail circuit comprising a first rail controller, a second rail circuit comprising a second rail controller, and a main controller in operative communication with the rail controllers, wherein the first rail controller is configured to control operation of the first rail circuit and the second rail controller is configured to control operation of the second rail circuit, the method comprising:
sampling, by the first rail controller, a first voltage supplied to the first rail circuit and transmitting, by the first rail controller, a first fault signal to the main controller upon a comparison between the sampled first voltage and a threshold being affirmative of an improper voltage condition regarding the first voltage;
sampling, by the second rail controller, a second voltage supplied to the second rail circuit and transmitting, by the second rail controller, a second fault signal to the main controller upon a comparison between the sampled second voltage and the threshold being affirmative of an improper voltage condition regarding the second voltage;
wherein at least one of the comparisons between the sampled voltages and the threshold is affirmative whereby at least one of the rail controllers transmits the first fault signal or the second fault signal to the main controller; and
in response to the main controller receiving the first fault signal or the second fault signal, controlling, by the main controller, both rail controllers to stop operation of both rail circuits.

13. The method of claim 12, wherein the OBC further includes a third rail circuit comprising a third rail controller, the main controller is further in operative communication with the third rail controller, and the third rail controller is configured to control operation of the third rail circuit, the method further comprising:
- sampling, by the third rail controller, a third voltage supplied to the third rail circuit and transmitting, by the third rail controller, a third fault signal to the main controller upon a comparison between the sampled third voltage and the threshold being affirmative of an improper voltage condition regarding the third voltage; and
- in response to the main controller receiving the third fault signal, controlling, by the main controller, all of the rail controllers to stop operation of all of the rail circuits.

14. The method of claim 13, wherein:
the first voltage is a first phase voltage supplied from a three-phase mains supply, the second voltage is a second phase voltage supplied from the three-phase mains supply, and the third voltage is a third phase voltage supplied from the three-phase mains supply.

15. The method of claim 13, further comprising:
after expiration of a delay following the operation of all of the rail circuits being stopped, controlling, by the main controller, all of the rail controllers to resume operation of all of the rail circuits; and
subsequent to the operation of all of the rail circuits being resumed, controlling, by the main controller, all of the rail controllers to stop operation of all of the rail circuits in response to receiving the first fault signal, the second fault signal or the third fault signal from any of the rail controllers.

16. An on-board battery charger (OBC), comprising:
a first rail circuit comprising a first rail controller;
a second rail circuit comprising a second rail controller; and
a controller configured to control the first rail controller and the second rail controller to sample a first voltage supplied to the first rail circuit and stop operation of both rail circuits upon a comparison between the sampled first voltage and a threshold being affirmative of an improper voltage condition regarding the first voltage.

17. The OBC of claim 16, wherein:
the controller is further configured to sample a second voltage supplied to the second rail circuit and stop operation of both rail circuits upon a comparison between the sampled second voltage and the threshold being affirmative of an improper voltage condition regarding the second voltage.

18. The OBC of claim 17, further comprising:
a third rail circuit; and
the controller is further configured to sample a third voltage supplied to the third rail circuit and stop operation of all of the rail circuits upon a comparison between the sampled third voltage and the threshold being affirmative of an improper voltage condition regarding the third voltage.

19. The OBC of claim 18, wherein:
the first voltage is a first phase voltage supplied from a three-phase mains supply, the second voltage is a second phase voltage supplied from the three-phase mains supply, and the third voltage is a third phase voltage supplied from the three-phase mains supply.

20. The OBC of claim 18, wherein:
the controller is further configured to resume operation of all of the rail circuits after expiration of a delay following the operation of all of the rail circuits being stopped; and
the controller is further configured to stop operation of all of the rail circuits upon a comparison between any of the sampled voltages and the threshold being affirmative subsequent to the operation of all of the rail circuits being resumed.

* * * * *